(12) United States Patent
Kung (10) Patent No.: US 9,532,467 B2
(45) Date of Patent: Dec. 27, 2016

(54) CIRCUIT SUBSTRATE

(71) Applicant: VIA Technologies, Inc., New Taipei (TW)

(72) Inventor: Chen-Yueh Kung, New Taipei (TW)

(73) Assignee: VIA Technologies, Inc., New Taipei (TW)

( * ) Notice: Subject to any disclaimer, the term of this patent is extended or adjusted under 35 U.S.C. 154(b) by 404 days.

(21) Appl. No.: 14/020,104

(22) Filed: Sep. 6, 2013

(65) Prior Publication Data

US 2014/0000953 A1 Jan. 2, 2014

Related U.S. Application Data

(62) Division of application No. 12/879,312, filed on Sep. 10, 2010, now Pat. No. 8,549,745.

(30) Foreign Application Priority Data

Jul. 26, 2010 (TW) .............. 99124535 A (51) Int. Cl.
| | |
|---|---|
| *H05K 3/46* | (2006.01) |
| *H05K 1/02* | (2006.01) |
| *H05K 3/04* | (2006.01) |
| *H05K 3/10* | (2006.01) |

(52) U.S. Cl.
CPC ............ *H05K 3/465* (2013.01); *H05K 1/0298* (2013.01); *H05K 3/045* (2013.01); *H05K 3/108* (2013.01); *H05K 2201/09509* (2013.01); *H05K 2201/09563* (2013.01); *H05K 2203/0554* (2013.01); *Y10T 29/49128* (2015.01); *Y10T 29/49155* (2015.01); *Y10T 29/49165* (2015.01)

(58) Field of Classification Search
USPC .................................................. 174/25, 261
See application file for complete search history.

(56) References Cited

U.S. PATENT DOCUMENTS

| | | | | |
|---|---|---|---|---|
| 4,736,521 | A * | 4/1988 | Dohya | H01L 23/5383 174/255 |
| 6,228,511 | B1 * | 5/2001 | Sachdev | H01L 21/486 174/261 |
| 6,287,968 | B1 * | 9/2001 | Yu | H01L 21/288 257/E21.174 |
| 7,230,188 | B1 * | 6/2007 | En | C23C 18/1607 174/257 |
| 2006/0186537 | A1 * | 8/2006 | Goto | H01L 23/49827 257/734 |
| 2009/0218123 | A1 * | 9/2009 | Yamamoto | H05K 1/0271 174/262 |
| 2009/0236750 | A1 * | 9/2009 | Chia | H01L 21/6835 257/774 |

* cited by examiner

*Primary Examiner* — William H Mayo, III
*Assistant Examiner* — Krystal Robinson
(74) *Attorney, Agent, or Firm* — J.C. Patents (57) ABSTRACT

A circuit substrate includes a base layer, a first patterned conductive layer, a dielectric layer, a conductive block and a second patterned conductive layer. The first patterned conductive layer is disposed on the base layer and has a first pad. The dielectric layer is disposed on the base layer and covers the first patterned conductive layer, wherein the dielectric layer has an opening and the first pad is exposed by the opening. The conductive block is disposed in the opening and covers the first pad. The second patterned conductive layer is disposed on a surface of the dielectric layer and has a second pad, wherein the second pad and the conductive block are integrally formed.

9 Claims, 6 Drawing Sheets

CIRCUIT SUBSTRATE

CROSS-REFERENCE TO RELATED APPLICATION

This application is a divisional of and claims the priority benefit of U.S. application Ser. No. 12/879,312, filed on Sep. 10, 2010, now allowed, which claims the priority benefit of Taiwan application Ser. No. 99124535, filed on Jul. 26, 2010. The entirety of each of the above-mentioned patent applications is hereby incorporated by reference herein and made a part of specification.

BACKGROUND OF THE INVENTION

Field of the Invention

The present invention relates to an electronic device, and more particularly, to a circuit substrate.

Description of Related Art

In current semiconductor package technology, a circuit substrate is one of the most frequently used components. A circuit substrate is mainly composed of a plurality of patterned conductive layers and a plurality of dielectric layers alternately stacked to one another. In addition, the patterned conductive layers are electrically connected through a plurality of conductive vias. With the increasing of the density of the circuit of the circuit substrate, how to effectively simplify the fabricating process of the circuit substrate and to use the limited space to deploy circuits has become an important subject.

SUMMARY OF THE INVENTION

The present invention provides a circuit substrate including a base layer, a first patterned conductive layer, a dielectric layer, a conductive block and a second patterned conductive layer. The first patterned conductive layer is disposed on the base layer and has a first pad. The dielectric layer is disposed on the base layer and covers the first patterned conductive layer, wherein the dielectric layer has an opening exposing the first pad. The conductive block is disposed in the opening and covers the first pad. The second patterned conductive layer is disposed on a surface of the dielectric layer and has a second pad, wherein the second pad is connected to the conductive block in a form of one piece.

The present invention provides a circuit substrate including a base layer, a first patterned conductive layer, a first dielectric layer, a first conductive block, a second patterned conductive layer, a second dielectric layer, a second conductive block and a third patterned conductive layer. The first patterned conductive layer is disposed on the base layer and has a first pad. The first dielectric layer is disposed on the base layer and covers the first patterned conductive layer, wherein the first dielectric layer has a first opening exposing the first pad. The first conductive block is disposed in the first opening and covers the first pad. The second patterned conductive layer is disposed on a surface of the first dielectric layer and has a second pad and a third pad, wherein the second pad is connected to the first conductive block in a form of one piece. The second dielectric layer is disposed on the first dielectric layer and covers the second patterned conductive layer, wherein the second dielectric layer has a second opening exposing the third pad. The second conductive block is disposed in the second opening and covers the third pad. The third patterned conductive layer is disposed on a surface of the second dielectric layer and has a fourth pad, wherein the fourth pad is connected to the second conductive block in a form of one piece.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
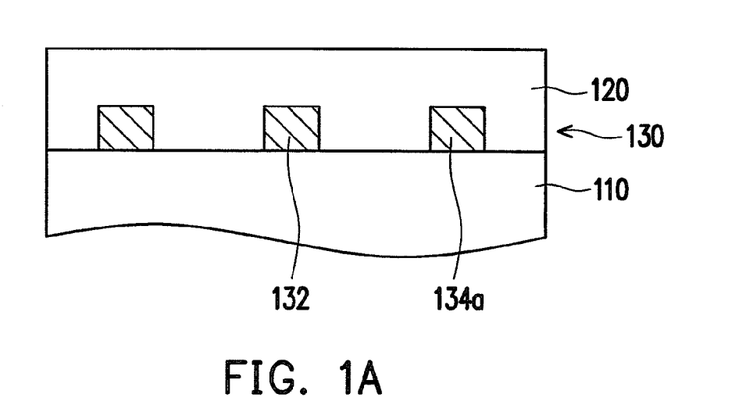
FIGS. 1A to 1I are schematic cross-sectional views illustrating a fabricating process of a circuit substrate according to one embodiment of the present invention.

FIGS. 1A to 1I are schematically cross-sectional views illustrating a fabricating process of a circuit substrate according to one embodiment of the present invention. As shown in FIG. 1A, a base layer 110, a dielectric layer 120 and a first patterned conductive layer 130 are provided. The first patterned conductive layer 130 is disposed on the base layer 110 and has a first pad 132. The dielectric layer 120 is disposed on the base layer 110 and covers the first patterned conductive layer 130. In one embodiment, the first patterned conductive layer 130 further has a wire 134a adjacent to the first pad 132. In other embodiments, the base layer 110 is not limited to a single layer and can be composed of a plurality of layers. Therefore, in the present embodiment, the single-layered base layer 110 in FIG. 1A is only an exemplar of the present invention. Furthermore, in the present embodiment, the first pad 132 can be regarded as an inner pad and can be connected to the first wire 134 shown in FIG. 2A so that the first pad 132 is regarded as an end structure extended from the first wire 134. The details of FIG. 2 are described hereafter.

Figure 1B:
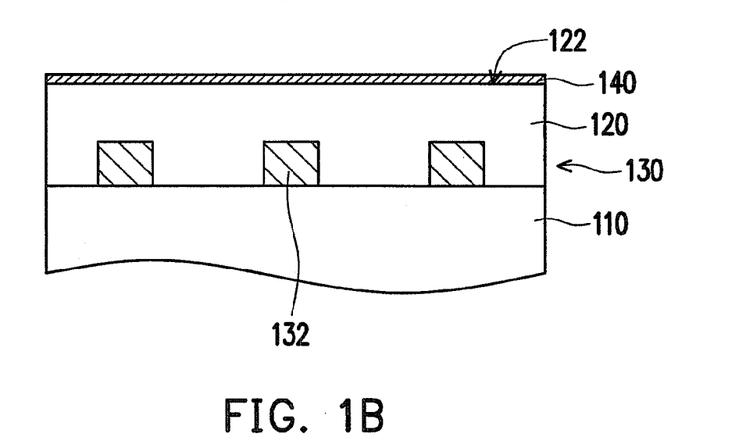
Figure 1C:
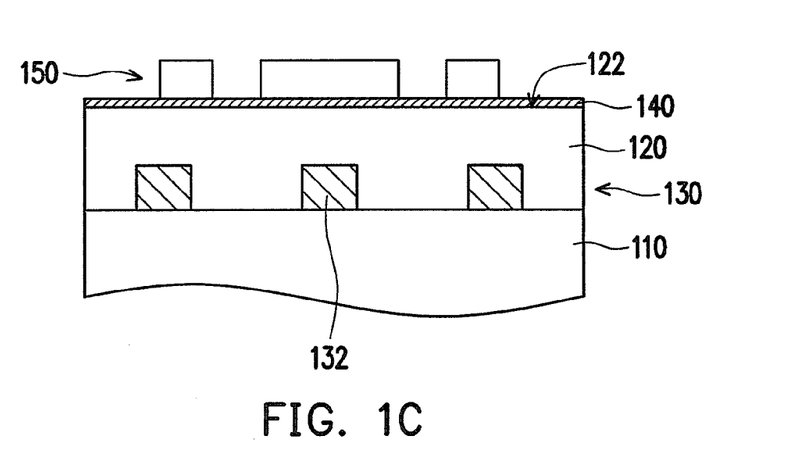
Figure 2A:
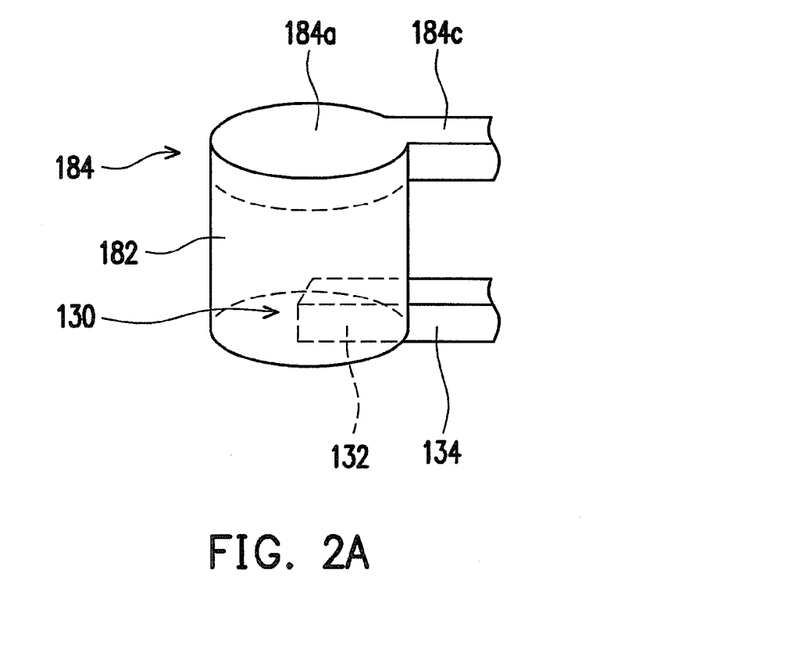
FIG. 2A is a 3D diagram of the first pad, the second pad and the conductive block in FIG. 1I.

Thereafter, referring to FIG. 1B and FIG. 1C, an electroplating seed layer 140 and a patterned mask layer 150 are formed on a surface 122 of the dielectric layer 120. The patterned mask layer 150 exposes a portion of the surface 122. Moreover, the patterned mask layer 150 can be made of, for example, photoresist material. More specifically, the patterned mask layer 150 is used to define the positions for the later formed conductive block, second pad and wire. In other words, the positions covered by the patterned mask layer 150 are the predetermined positions for the later formed conductive block, second pad and wire. The conductive block, the second pad and the wire are described in the following descriptions.

Figure 1D:
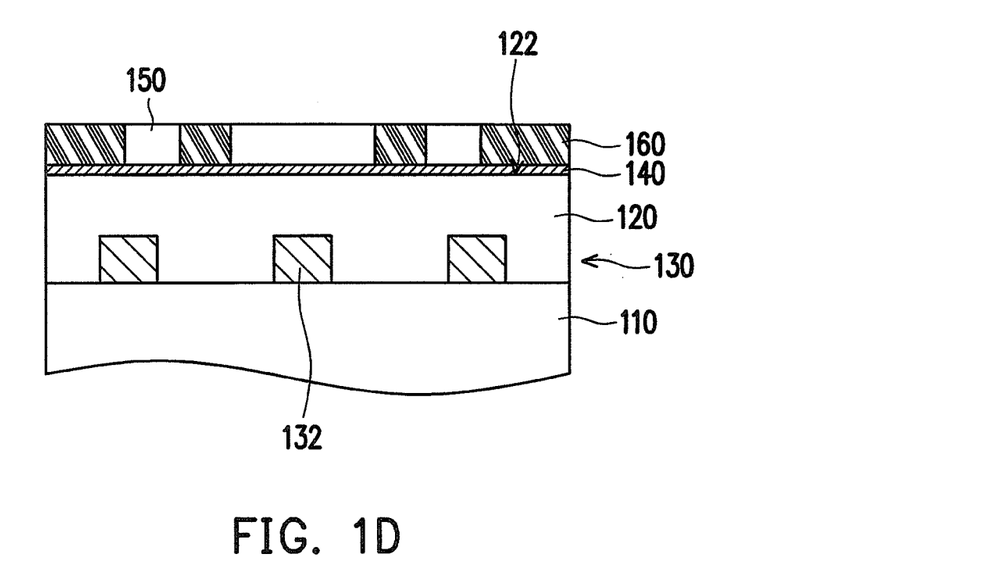

As shown in FIG. 1D, a metal mask layer 160 is formed on the surface 122 exposed by the patterned mask layer 150. The material of the metal mask layer 160 is different from that of the patterned mask layer 150. In details, in the present embodiment, the patterned mask layer 150 exposes a portion of the electroplating seed layer 140 on the surface 122 and the metal mask layer 160 is formed by the electroplating process and is formed on the portion of the electroplating seed layer 140 exposed by the patterned mask layer 150.

Figure 1E:
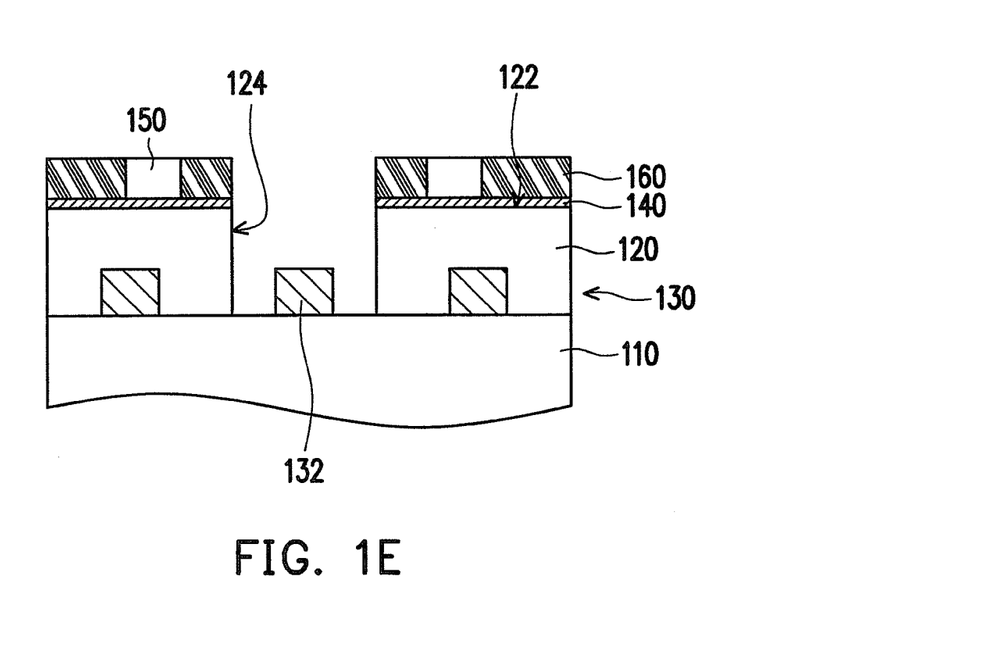

As shown in FIG. 1E, a portion of the patterned mask layer 150 and a portion of the dielectric layer 120 are removed to form an opening 124 exposing the first pad 132. In the present embodiment, since the material of the patterned mask layer 150 is different from that of the metal mask layer 160, the metal mask layer 160 remains during the step shown in FIG. 1E is performed. For instance, when the portion of the patterned mask layer 150 and the portion of the dielectric layer 120 are removed by the laser, instead of being totally removed, the metal mask layer 160 is slightly damaged because the metal mask layer 160 reflects the laser. Further, in the present step, since the laser can be used to remove the material at a chosen specific position, only the material on the predetermined positions for the conductive block and the second pad is removed to form the opening 124.

Figure 1F:
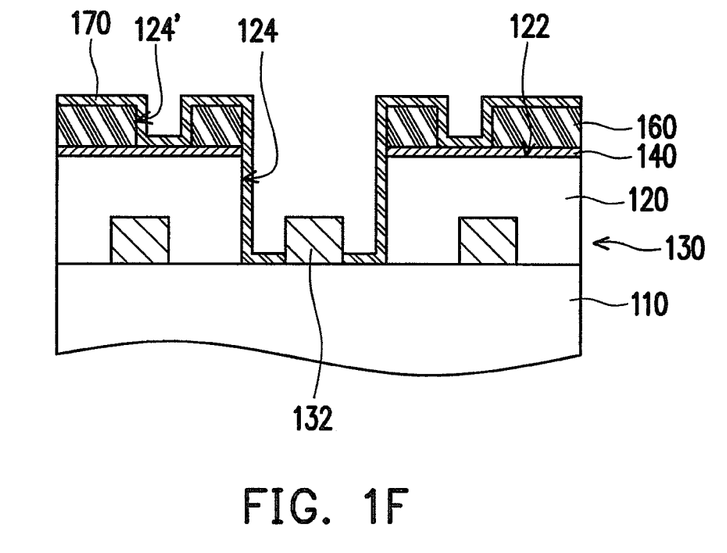

As shown in FIG. 1F, the patterned mask layer 150 is removed to form an opening 124' in the metal mask layer 160 and the opening 124' exposes a portion of the surface 122. More specifically, the position where the opening 124' is located is used for forming the wire thereon in the later performed process step. That is, the shape of the opening 124' is a long trench shape. In addition, since the depth of the opening 124 is different from that of the opening 124', the process parameters adopted for operating the laser to form the openings 124 and 124' can be different when the openings 124 and 124' are both formed by using laser. In one embodiment, if the patterned mask layer 150 is made of photoresist material, instead of the laser, the conventional step of removing the photoresist material can be adopted in the present step. Next, an electroplating seed layer 170 is formed on the metal mask layer 160, the dielectric layer 120 and the inner walls of the openings 124 and 124'. In details, in the present embodiment, the metal mask layer 160 exposes the electroplating seed layer 140 on the surface 122 of the dielectric layer 120 and a portion of the electroplating seed layer 170 is formed on the electroplating seed layer 140 exposed by the metal mask layer 160.

Figure 1G:
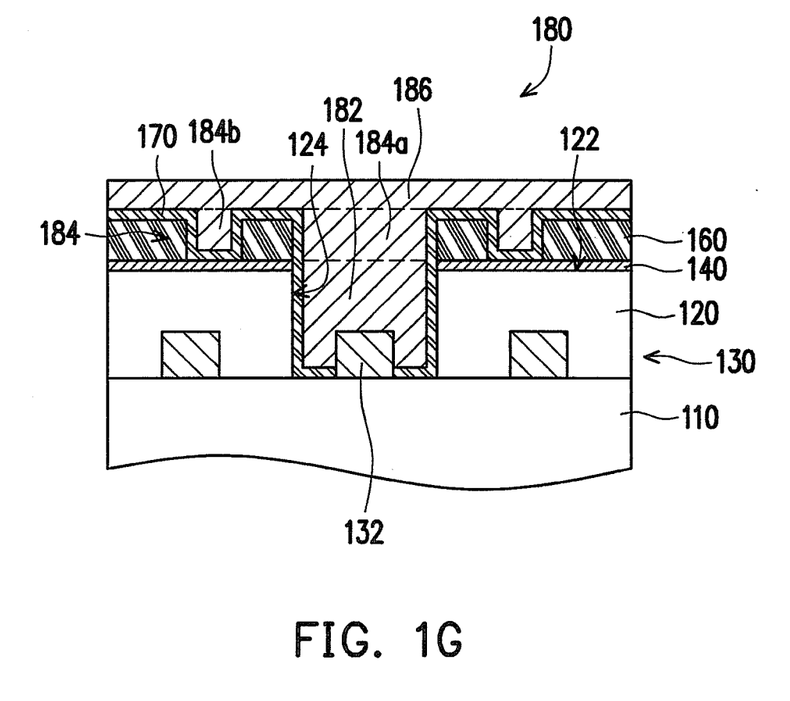

As shown in FIG. 1G, an electroplating metal structure 180 is formed on the electroplating seed layer 170 and covers the metal mask layer 160, the dielectric layer 120, the openings 124 and 124' and the first pad 132. The electroplating metal structure 180 comprises a conductive block 182, a second patterned conductive layer 184 and a metal layer 186. The metal layer 186 covers the second patterned conductive layer 184 and the metal mask layer 160. The second patterned conductive layer 184 is disposed on a portion of the surface 122 exposed by the metal mask layer 160 and has a second pad 184a and a wire 184b. The conductive block 182 is connected between the first pad 132 and the second pad 184a and the conductive block 182 and the second pad 184a are formed in one piece. In details, in the present embodiment, the second pad 184a and the conductive block 182 are located in the opening 124. The wire 184b is located in the opening 124'.

Figure 1H:
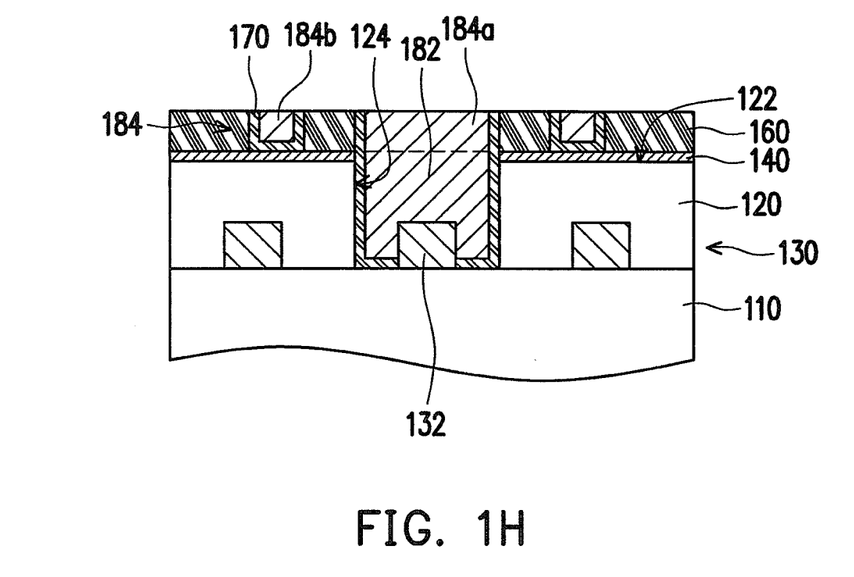
Figure 1I:
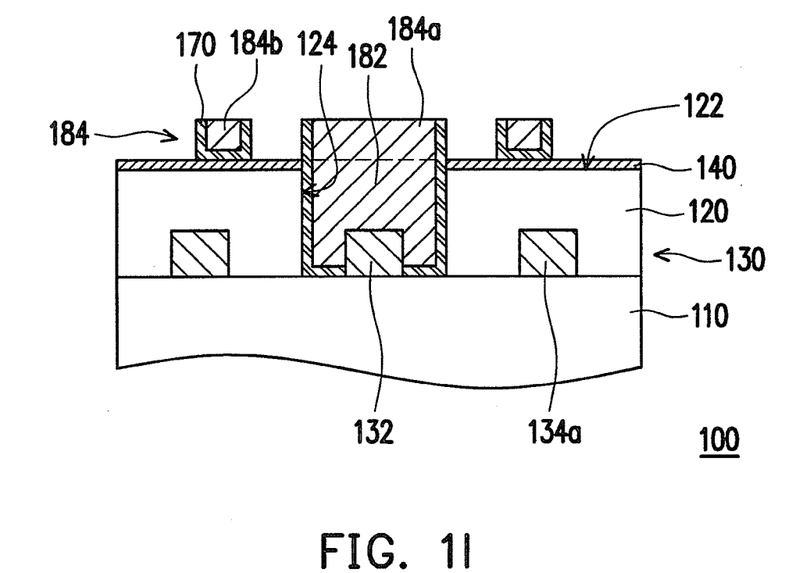

As shown in FIG. 1H, the metal layer 186 is removed by the etching process or the polishing process to expose the second patterned conductive layer 184 and the metal mask layer 160. Finally, as shown in FIG. 1I, the metal mask layer 160 is removed to finish the manufacture of the circuit substrate 100. In the present embodiment, the metal mask layer 160 is made of, for example, nickel, and the conductive block 182 and the second patterned conductive layer 184 can be made of, for example, copper. Hence, by using selectively etching process to remove the metal mask layer 160, the conductive block 182 and the second patterned conductive layer 184 remains. It should be noticed that the conductive block 182 and the second patterned conductive layer 184 of the present embodiment are simultaneously formed (as shown in FIGS. 1F through 1H), and the second patterned conductive layer 184 has a second pad 184a which is formed with conductive block 182 in one piece. Comparing with the conventional process for forming the second pad and the conductive block in separated steps, in the present invention, the alignment accuracy between the conductive block 182 and the second patterned conductive layer 184 is improved (more particularly, the alignment accuracy between second pad 184a and the conductive block 182), which benefits the increasing of the integration of the circuit layout.

As shown in FIG. 1I, the circuit substrate 100 of the present embodiment comprises the base layer 110, the first patterned conductive layer 130, the dielectric layer 120, the conductive block 182 and the second patterned conductive layer 184. The first patterned conductive layer 130 is disposed on the base layer 110 and has the first pad 132. In one embodiment, the first patterned conductive layer 130 further has the wire 134a adjacent to the first pad 132. The dielectric layer 120 is disposed on the base layer 110 and covers the first patterned conductive layer 130, wherein the dielectric layer 120 has the opening 124 exposing the first pad 132. The conductive block 182 is disposed in the opening 124 and covers the first pad 132. The second patterned conductive layer 184 is disposed on the surface 122 of the dielectric layer 120 and has the second pad 184a and the wire 184b, wherein the second pad 184a is connected to the conductive block 182 in a form of one piece.

Figure 2B:
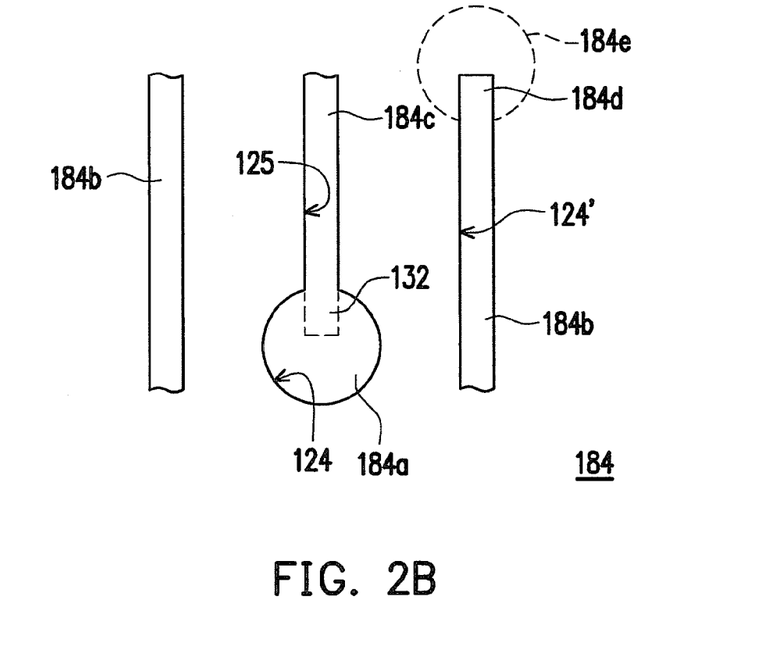
FIG. 2B is a top view of FIG. 1I.

FIG. 2A is a 3D diagram of the first pad, the second pad and the conductive block in FIG. 1I. FIG. 2B is a top view of FIG. 1I. As shown in FIG. 1I, FIG. 2A and FIG. 2B, in details, the second patterned conductive layer 184 of the present embodiment further has another wire 184c, and the wire 184c is connected to the second pad 184a. In other words, all of the second pad 184a, the wire 184b and the wire 184c are belonged to the second patterned conductive layer 184. In the process, the positioning step can be performed first to form the opening 124 predetermined for forming the second pad 184a (including the conductive block 182) therein. Then, the trench-shape openings 124' and 125 predetermined for forming the wires 184b and 184c therein are formed, wherein the opening 125 predetermined for the wire 184c is communicated with the opening 124 predetermined for the second pad 184a (including the conductive block 182). Finally, a conductive material is formed in the openings 124, 124' and 125.

In another embodiment, except for the wire 184c having an end connected to the second pad 184a, an end of the wire 184b adjacent to the second pad 184a is regarded as a pad 184d for internal connection. The structure of the pad 184d is similar to that of the first pad. In one embodiment, the process steps shown in FIGS. 1A through 1I can be applied on the pad 184d which is the end of the wire 184b to obtain a pad 184e (denoted by dotted line) with the structure similar to that of the second pad. The pad 184e is connected to the pad 184d through the conductive block (not shown). Moreover, in another embodiment, the end of the wire 184b can be used as a pad for external connection and the end of the wire 184b is connected to the external bump or solder ball (not shown). The structure of the end of the wire 184b is similar to that of the first pad. The 3D diagrams of the aforementioned wire 184*b* and pads 184*d* and 184*e* are similar to those of the wire 134 and the pads 132 and 184*a* shown in FIG. 2A. In the other embodiment, the first patterned conductive layer 130 can also has the wire 134 having an end constituting the first pad 132.

The second pad 184*a* of the present embodiment and the conductive block 182 are simultaneously formed in one piece together in the same process step so that the outer diameter of the second pad 184*a* is substantially equal to the outer diameter of the conductive block 182. Hence, it is not necessary to preserve spaces for avoiding the misalignment in the process steps. Therefore, the surface 122 of the dielectric layer 120 can provide sufficient spaces for circuit layout and the integration of the circuit layout is increased. In addition, the inner diameter of the opening 124 of the present embodiment is larger than the outer diameter of the first pad 132. Therefore, the outer diameter of the first pad 132 is smaller than the outer diameter of the conductive block 182 so that the first pad 132 is covered by the conductive block 182. Thus, the distance between the adjacent first pads 132 or the distance between the first pad 132 and the adjacent wire 134*a* (as shown in FIG. 1A) can be decreased so that the integration of the circuit layout is increased.

Figure 3:
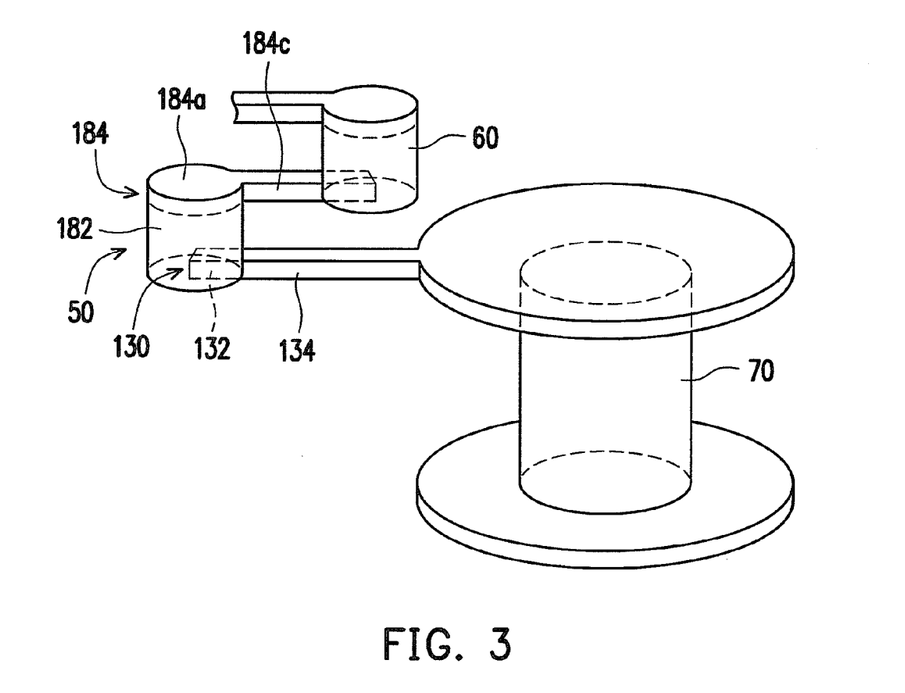
FIG. 3 is a schematic 3D diagram showing a portion of the conductive structure of a multi-layered circuit substrate on which the conductive via in FIG. 2A is applied.

FIG. 3 is a schematic 3D diagram showing a portion of the conductive structure of a multi-layered circuit substrate on which the conductive via in FIG. 2A is applied. The first pad 132, the conductive block 182 and the second pad 184*a* shown in FIG. 2A can compose a conductive via 50 (shown in FIG. 3) and can be applied on a portion of the conductive structure of the multi-layered circuit substrate.

In details, the conductive via 50 and other conductive components (such as conductive via 60 and plating via 70) of the multi-layered circuit substrate can accomplish the electrical conduction between two patterned conductive layers of the multi-layered circuit substrate. Furthermore, the first pad 132 or the second pad 184*a* disposed on different positions reveals different functions. If the first pad 132 or the second pad 184*a* is belonged to one inner layer of the multi-layered circuit substrate, the first pad 132 or the second pad 184*a* is regarded as an internal pad. If the first pad 132 or the second pad 184*a* is located at the outmost layer of the multi-layered circuit substrate, the first pad 132 or the second pad 184*a* is regarded as an external pad. Herein, in the present invention, the first pad 132 can be regarded as the end structure of the wire or regarded as the pad with the relatively small size similar to the cross-sectional area of the wire. The second pad 184*a* can be regarded as the relatively large pad, which and the conductive block are formed in one piece by using the process steps shown in FIGS. 1A through 1I. Either the first pad or the second pad can be connected to one of combinations of the wire, the bump or the conductive block.

Figure 4:
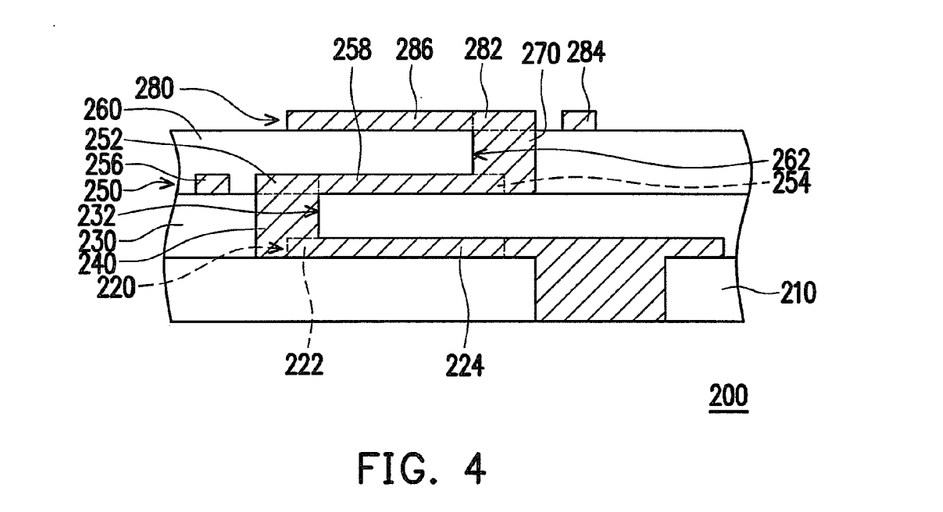
FIG. 4 is a schematic cross-sectional view of a multi-layered circuit substrate according to one embodiment of the present invention.

A structure of the multi-layered circuit substrate of one embodiment of the present invention is described in the following descriptions accompanied with the drawings. FIG. 4 is a schematic cross-sectional view of a multi-layered circuit substrate according to one embodiment of the present invention. As shown in FIG. 4, a multi-layered circuit substrate 200 includes a base layer 210, a first patterned conductive layer 220, a first dielectric layer 230, a first conductive block 240, a second patterned conductive layer 250, a second dielectric layer 260, a second conductive block 270 and a third patterned conductive layer 280.

The first patterned conductive layer 220 is disposed on the base layer 210 and has a first pad 222. The first dielectric layer 230 is disposed on the base layer 210 and covers the first patterned conductive layer 220, wherein the first dielectric layer 230 has a first opening 232 exposing the first pad 222. The first conductive block 240 is disposed in the first opening 232 and covers the first pad 222. The second patterned conductive layer 250 is disposed on a surface of the first dielectric layer 230 and has a second pad 252 and a third pad 254, wherein the second pad 252 is connected to the first conductive block 240 in a form of one piece.

The second dielectric layer 260 is disposed on the first dielectric layer 230 and covers the second patterned conductive layer 250, wherein the second dielectric layer 260 has a second opening 262 exposing the third pad 254. The second conductive block 270 is disposed in the second opening 262 and covers the third pad 254. The third patterned conductive layer 280 is disposed on a surface of the second dielectric layer 260 and has a fourth pad 282, wherein the fourth pad 282 is connected to the second conductive block 270 in a form of one piece.

In details, the outer diameter of the first pad 222 is smaller than the outer diameter of the first conductive block 240 so that the first pad 222 is covered by the first conductive block 240. The second patterned conductive layer 250 further comprises a first wire 256 and a second wire 258. The first wire 256 is adjacent to the second pad 252 and the second pad 252 is connected to the second wire 258. One end of the second wire 258 constitutes the third pad 254. The first patterned conductive layer 220 further comprises a third wire 224 and one end of the third wire 224 constitutes the first pad 222. The outer diameter of the second pad 252 is substantially equal to the outer diameter of the first conductive block 240.

Moreover, the diameter of the third pad 254 is smaller than the outer diameter of the second conductive block 270 so that the third pad 254 is covered by the second conductive block 270. The third patterned conductive layer 280 further comprises a fourth wire 284 and a fifth wire 286. The fourth wire 284 is adjacent to the fourth pad 282 and the fourth pad 282 is connected to the fifth wire 286. The outer diameter of the fourth pad 282 is substantially equal to the outer diameter of the second conductive block 270.

It should be noticed that, in the present invention, the number of the layers of the multi-layered circuit substrate is not limited. There are three patterned conductive layers (the first patterned conductive layer 220, the second patterned conductive layer 250 and the third patterned conductive layer 280) and two dielectric layers (the first dielectric layer 230 and the second dielectric layer 260). However, in the other embodiments, the multi-layered circuit substrate can be composed of more than three patterned conductive layer and more than two dielectric layers.

Altogether, in the circuit substrate process of the present invention, the conductive block and the second patterned conductive layer are simultaneously formed so that the alignment accuracy between the conductive block and the second patterned conductive layer is improved. Hence, the integration of the circuit layout is increased. Moreover, since the conductive block and the second patterned conductive layer are simultaneously formed, the outer diameter of the second pad of the second patterned conductive layer can be controlled to be equal to the outer diameter of the conductive block. Therefore, the surface of the dielectric layer can provide sufficient space for circuit layout. Further, the first pad can be composed of one end of the wire of the patterned conductive layer so that the outer diameter of the first pad is smaller than the outer diameter of the conductive block. Hence, the distance between the first pad and the adjacent second pad is decreased or the distance between the first pad and the adjacent wire is decreased. Thus, the integration of the circuit layout is increased.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A circuit substrate, comprising: a base layer; a first patterned conductive layer disposed on the base layer and having a first pad;
a dielectric layer disposed on the base layer and covering the first patterned
conductive layer, wherein the dielectric layer has an opening exposing the first pad; a conductive block disposed in the opening and covering the first pad; a second patterned conductive layer disposed on a surface of the dielectric layer and having a second pad, wherein the second pad is connected to the conductive block in a form of one piece, the second patterned conductive layer further comprises a first wire and the second pad is connected to the first wire, and the second pad, the first wire and the conductive block are integrally formed; and an electroplating seed layer covering sidewalls of the conductive block and sidewalls of the second patterned conductive layer, wherein a maximum outer diameter of the second pad is substantially equal to a maximum outer diameter of the conductive block; wherein an outer diameter of the first pad is smaller than an outer diameter of the conductive block so that the first pad is covered by the conductive block.

2. The circuit substrate of claim 1, wherein the electroplating seed layer covers sidewalls of the wire.

3. The circuit substrate of claim 1, wherein the first patterned conductive layer further comprises a second wire and the first pad is composed of one end of the second wire, such that the first pad is connected to the second wire.

4. A circuit substrate, comprising:
a base layer;
a first patterned conductive layer disposed on the base layer and having a first pad; a first dielectric layer disposed on the base layer and covering the first patterned conductive layer, wherein the first dielectric layer has a first opening exposing the first pad; a first conductive block disposed in the first opening and covering the first pad; a second patterned conductive layer disposed on a surface of the first dielectric layer and having a second pad and a third pad, wherein the second pad is connected to the first conductive block in a form of one piece, the second patterned conductive layer further comprises a first wire and the second pad is connected to the first wire, and the second pad, the first wire and the first conductive block are integrally formed; an electroplating seed layer covering sidewalls of the first conductive block and sidewalls of the second patterned conductive layer; a second dielectric layer disposed on the first dielectric layer and covering the second patterned conductive layer, wherein the second dielectric layer has a second opening exposing the third pad; a second conductive block disposed in the second opening and covering the third pad; and a third patterned conductive layer disposed on a surface of the second dielectric layer and having a fourth pad, wherein the fourth pad is connected to the second conductive block in a form of one piece; wherein an outer diameter of the first pad is smaller than an outer diameter of the conductive block so that the first pad is covered by the conductive block.

5. The circuit substrate of claim 4, wherein the electroplating seed layer covers sidewalls of the wire.

6. The circuit substrate of claim 5, wherein the third pad is composed of one end of the first wire, such that the first wire is connected to the second pad and the third pad.

7. The circuit substrate of claim 4, wherein an outer diameter of the third pad is smaller than an outer diameter of the second conductive block so that the third pad is covered by the second conductive block.

8. The circuit substrate of claim 4, wherein the third patterned conductive layer further comprises a second wire and the fourth pad is connected to the second wire, such that the fourth pad is connected to the second wire and and the second conductive block are integrally formed.

9. The circuit substrate of claim 4, wherein an outer diameter of the fourth pad is substantially equal to an outer diameter of the second conductive block.

* * * * *